(12) United States Patent
Cho et al.

(10) Patent No.: US 12,035,494 B2
(45) Date of Patent: Jul. 9, 2024

(54) FLEXIBLE DISPLAY DEVICE INCLUDING CONNECTION FRAMES AND HINGE MEMBERS

(71) Applicant: LG DISPLAY CO., LTD., Seoul (KR)

(72) Inventors: SeokHyo Cho, Goyang-si (KR); JaeHo Kim, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/962,146

(22) Filed: Oct. 7, 2022

(65) Prior Publication Data

US 2023/0209751 A1    Jun. 29, 2023

(30) Foreign Application Priority Data

Dec. 23, 2021 (KR) .................. 10-2021-0186558
May 19, 2022 (KR) .................. 10-2022-0061390

(51) Int. Cl.
*H05K 5/02* (2006.01)

(52) U.S. Cl.
CPC .................................. *H05K 5/0226* (2013.01)

(58) Field of Classification Search
CPC ........ G09G 3/03; G09G 3/035; G06F 1/1652; G06F 1/1624; G06F 1/1675; H05K 5/0226
See application file for complete search history.

(56) References Cited

U.S. PATENT DOCUMENTS

| 9,116,662 | B1* | 8/2015 | Song | G06F 1/1601 |
| 9,123,290 | B1* | 9/2015 | Cho | G06F 1/1652 |
| 9,390,642 | B2 | 7/2016 | Kim et al. | |
| 9,690,330 | B2* | 6/2017 | Kim | G06F 1/1637 |
| 9,727,080 | B2* | 8/2017 | Jung | G06F 1/1652 |
| 10,476,011 | B2* | 11/2019 | Kang | G02F 1/133308 |
| 11,163,335 | B1* | 11/2021 | Tzeng | G06F 1/1652 |
| 11,216,039 | B2* | 1/2022 | Jan | G06F 1/1681 |
| 11,416,034 | B2* | 8/2022 | Yoo | G06F 1/1652 |
| 11,749,138 | B2* | 9/2023 | Park | G09F 9/301 361/679.01 |

(Continued)

FOREIGN PATENT DOCUMENTS

| KR | 20-0250802 Y1 | 11/2001 |
| KR | 10-0994455 B1 | 11/2010 |

(Continued)

*Primary Examiner* — Rockshana D Chowdhury
*Assistant Examiner* — Douglas R Burtner
(74) *Attorney, Agent, or Firm* — Birch, Stewart, Kolasch & Birch, LLP

(57) ABSTRACT

A flexible display device including connection frames and hinge members, can include a display panel, a back cover supporting a rear surface of the display panel, a plurality of fixing sliders fixed on a rear surface of the back cover and arranged along a longitudinal direction, a central frame disposed at a center of the rear surface of the back cover and having first and second longitudinal ends, a pair of connection frames rotatably connected to the first and second longitudinal ends of the central frame and provided with slot holes through which respective fixing sliders among the plurality of fixing sliders are slidably supported, and a plurality of hinge members. Each hinge member connects a respective one of the first and second longitudinal ends of the central frame to a respective one of the pair of connection frames.

15 Claims, 12 Drawing Sheets

(56) References Cited

U.S. PATENT DOCUMENTS

| | | | | |
|---|---|---|---|---|
| 2012/0281367 A1* | 11/2012 | He | ........................ | G02F 1/1333 |
| | | | | 361/728 |
| 2014/0354519 A1* | 12/2014 | Lee | ........................ | G09F 9/301 |
| | | | | 345/76 |
| 2015/0192952 A1* | 7/2015 | Jung | ..................... | G06F 1/1601 |
| | | | | 361/747 |
| 2016/0050772 A1 | 2/2016 | Park et al. | | |
| 2016/0224056 A1* | 8/2016 | Guo | ........................ | G06F 1/1601 |
| 2019/0237685 A1* | 8/2019 | Kang | ....................... | G09F 9/301 |
| 2019/0239369 A1* | 8/2019 | Lan | ........................ | G06F 1/1652 |
| 2020/0333846 A1* | 10/2020 | Jan | ........................ | G06F 1/1652 |
| 2020/0409418 A1 | 12/2020 | Yoo et al. | | |
| 2021/0191465 A1* | 6/2021 | De Saulles | ........... | G06F 1/1641 |
| 2021/0280098 A1* | 9/2021 | Shen | ..................... | H04N 13/388 |
| 2022/0147103 A1* | 5/2022 | Cheng | ................... | G06F 1/1681 |
| 2023/0209742 A1* | 6/2023 | Cho | ..................... | H05K 5/0217 |
| | | | | 361/807 |

FOREIGN PATENT DOCUMENTS

| | | |
|---|---|---|
| KR | 10-2013-0117110 A | 10/2013 |
| KR | 10-2014-0067535 A | 6/2014 |
| KR | 10-1399209 B1 | 6/2014 |
| KR | 10-2014-0105148 A | 9/2014 |
| KR | 10-1507206 B1 | 3/2015 |
| KR | 10-2015-0136429 A | 12/2015 |
| KR | 10-2016-0019761 A | 2/2016 |
| KR | 101918989 B1 | 11/2018 |
| KR | 10-2019-0092966 A | 8/2019 |
| KR | 10-2021-0001447 A | 1/2021 |

* cited by examiner

FLEXIBLE DISPLAY DEVICE INCLUDING CONNECTION FRAMES AND HINGE MEMBERS

CROSS REFERENCE TO RELATED APPLICATIONS

This application claims the priority benefit of Korean Patent Application No. 10-2021-0186558, filed on Dec. 23, 2021 in the Republic of Korea, and Korean Patent Application No. 10-2022-0061390, filed on May 19, 2022 in the Republic of Korea, the entire contents of all these applications being hereby expressly incorporated herein by reference into the present application.

BACKGROUND

Field of the Disclosure

Embodiments of the present disclosure relate to a flexible display device.

Description of the Related Art

In general, a liquid crystal display (LCD) device, a plasma display device, a field emission display device, and a light emitting display device, and so on are under active study as flat display devices. Among them, the LCD device and the light emitting display device have attracted much interest due to their benefits of mass production, ease of driving means, and realization of high image quality.

Recently, in addition to the research and development of these flat display devices, the need for R&D is particularly highlighted in terms of the structure of flexible display devices such as curved and rolling types that can appeal to users more.

However, such a flexible display device can have a structure in which a mechanism for changing the curvature must be coupled to the rear surface of the display panel in order to change the curvature of the display panel. Therefore, there can be a difficulty in realizing a constant curvature from the central portion of the display panel to both ends of the display panel due to the limitation of the coupling mechanism.

In addition, it can be difficult to continuously maintain the changed curvature while rapidly changing the curvature of the display panel to various curvatures desired by the user. Accordingly, there can be a limitation in that it can be difficult to accommodate the various needs of users.

Therefore, there is a need for research to address at least the above-mentioned limitations.

SUMMARY OF THE DISCLOSURE

Embodiments of the present disclosure provide a flexible display device in which a user can arbitrarily change the curvature into a flat display mode and a curved display mode.

Further, embodiments of the present disclosure provide a flexible display device capable of accommodating various needs of a user by being able to easily implement a desired curvature from a central portion of a display panel to both ends of a display panel irrespective of its size in the display device.

The objects of the embodiments of the present disclosure are not limited to what have been described above, and those skilled in the art will clearly understand other objects not mentioned herein from the following description.

According to an aspect, embodiments of the present disclosure provide a flexible display device including a back cover supporting a rear surface of a display panel, a plurality of fixing sliders fixed to a rear surface of the back cover, a central frame disposed at a rear center of the back cover, a pair of connection frames rotatably connected to both ends of the central frame and provided with slot holes through which the fixing sliders are slidably supported, and a hinge member connecting the central frame and the connecting frames.

According to embodiments of the present disclosure, there can be provided a flexible display device in which a user can arbitrarily change the curvature into a flat display mode and a curved display mode.

According to embodiments of the present disclosure, there can be provided a flexible display device capable of accommodating various needs of a user by being able to easily implement a desired curvature from a central portion of a display panel to both ends of a display panel irrespective of its size in the display device.

BRIEF DESCRIPTION OF THE DRAWINGS

The above and other aspects, features and advantages of the present disclosure will be more apparent from the following detailed description taken in conjunction with the accompanying drawings.

DETAILED DESCRIPTION OF THE EMBODIMENTS

Figure 1:
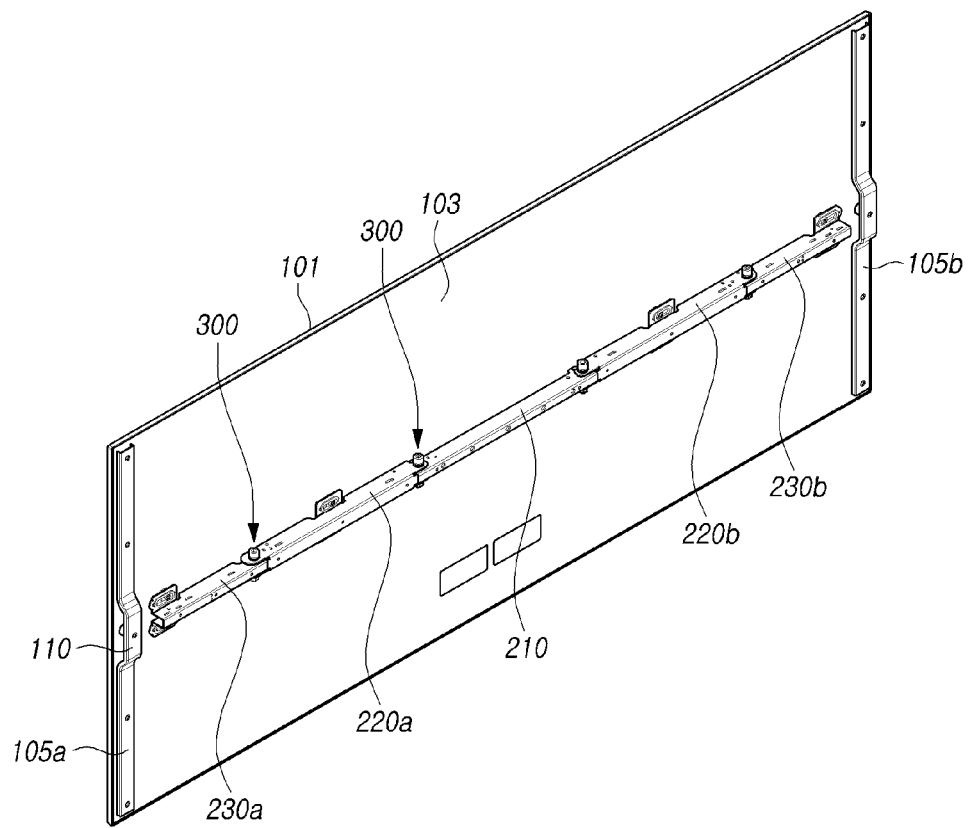
FIG. 1 is a perspective view showing a flexible display device according to embodiments of the present disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description can make the subject matter in some embodiments of the present disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" can be used herein to describe elements of the disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element can be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms can be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that can be caused by various factors (e.g., process factors, internal or external impact, noise, etc.) even when a relevant description is not specified. Further, the term "may" fully encompasses all the meanings of the term "can".

Figure 2:
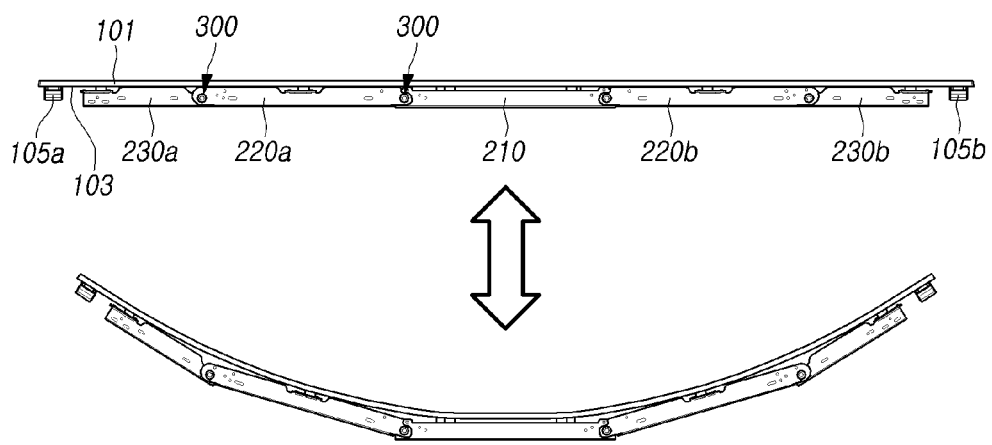
FIGS. 2 and 3 are plan views showing a flexible display device according to embodiments of the present disclosure.
Figure 3:
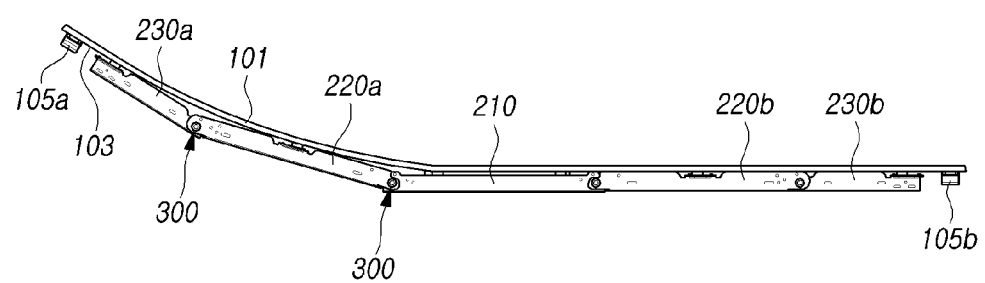
Figure 4:
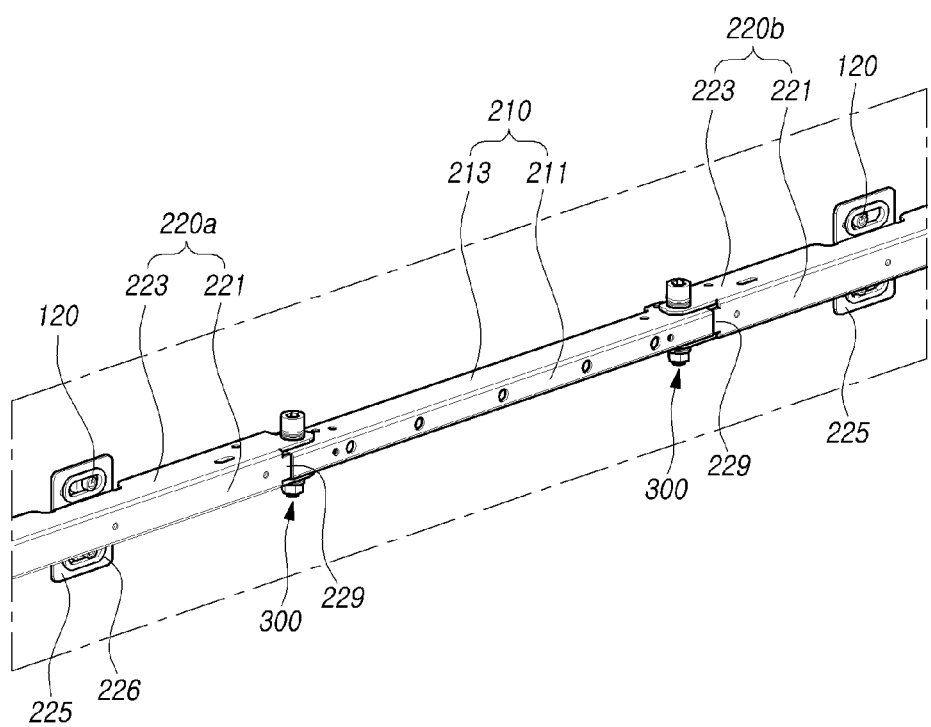
FIGS. 4 to 8 are perspective views showing a flexible display device according to embodiments of the present disclosure.
Figure 5:
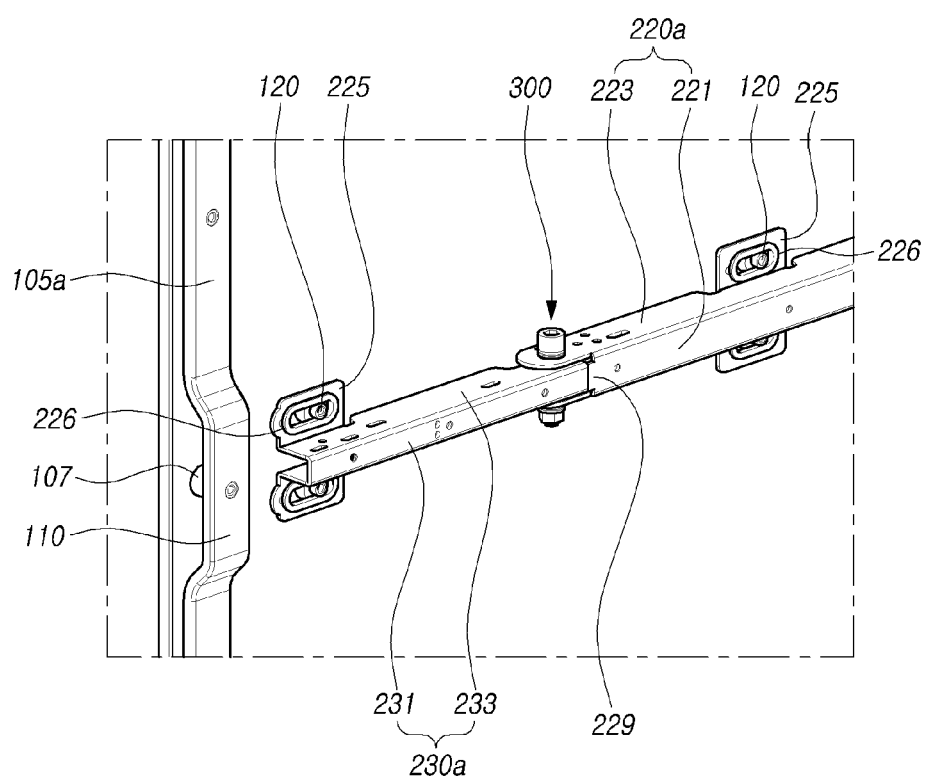
Figure 6:
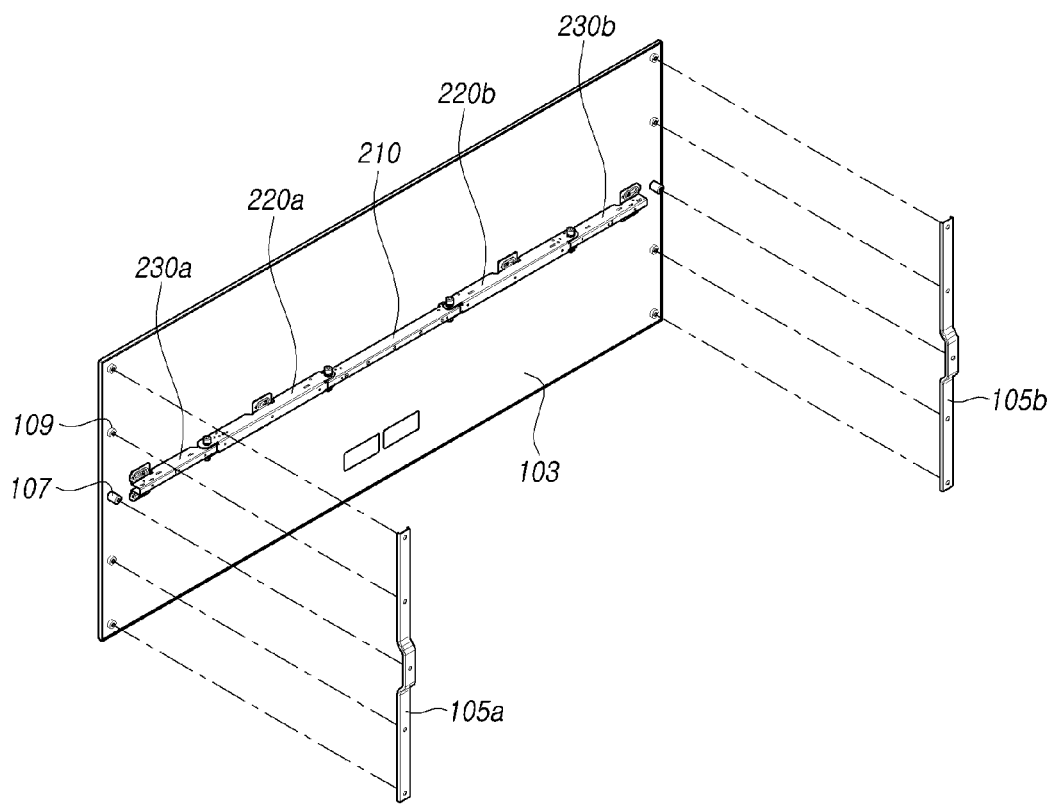
Figure 7:
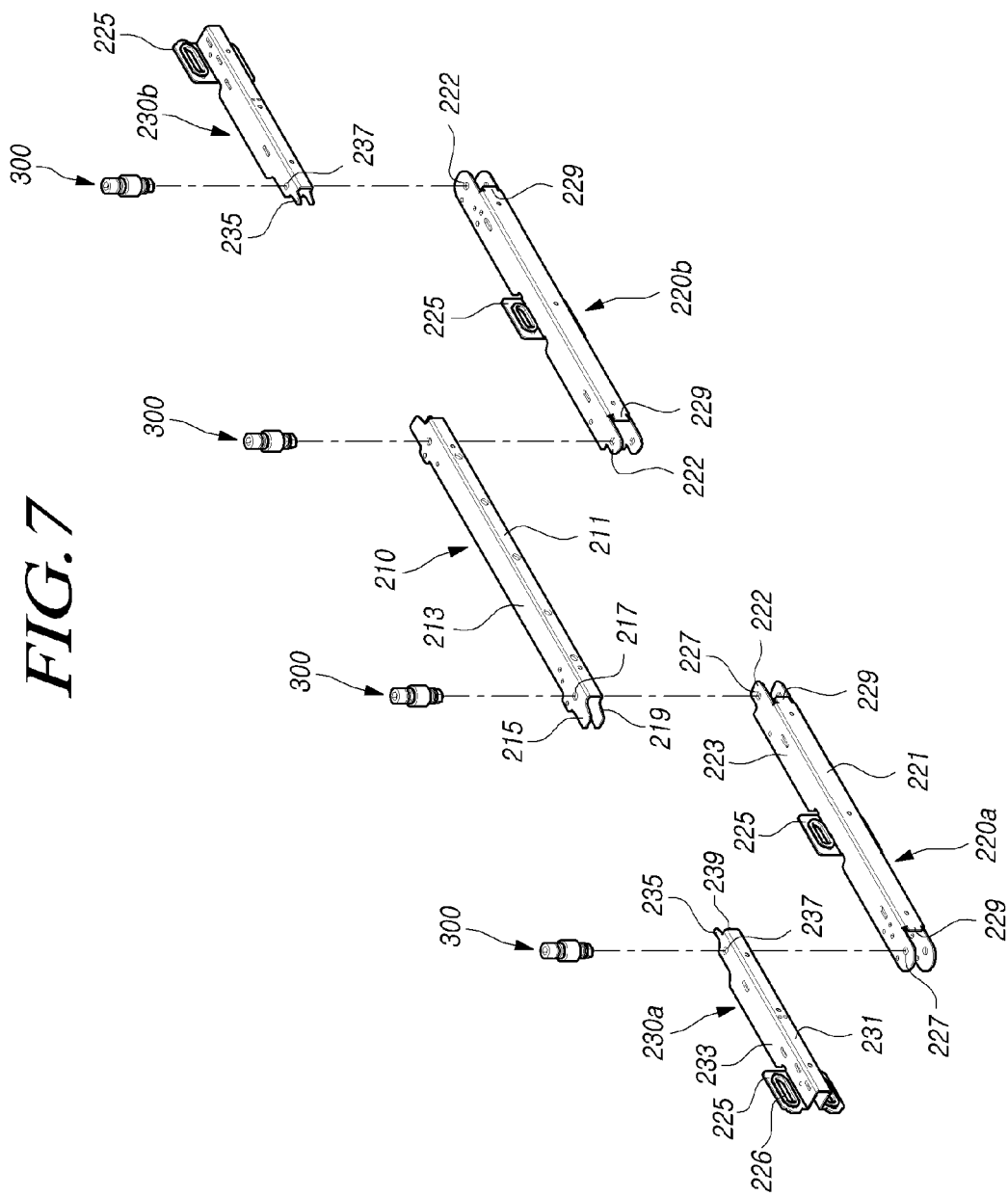
Figure 8:
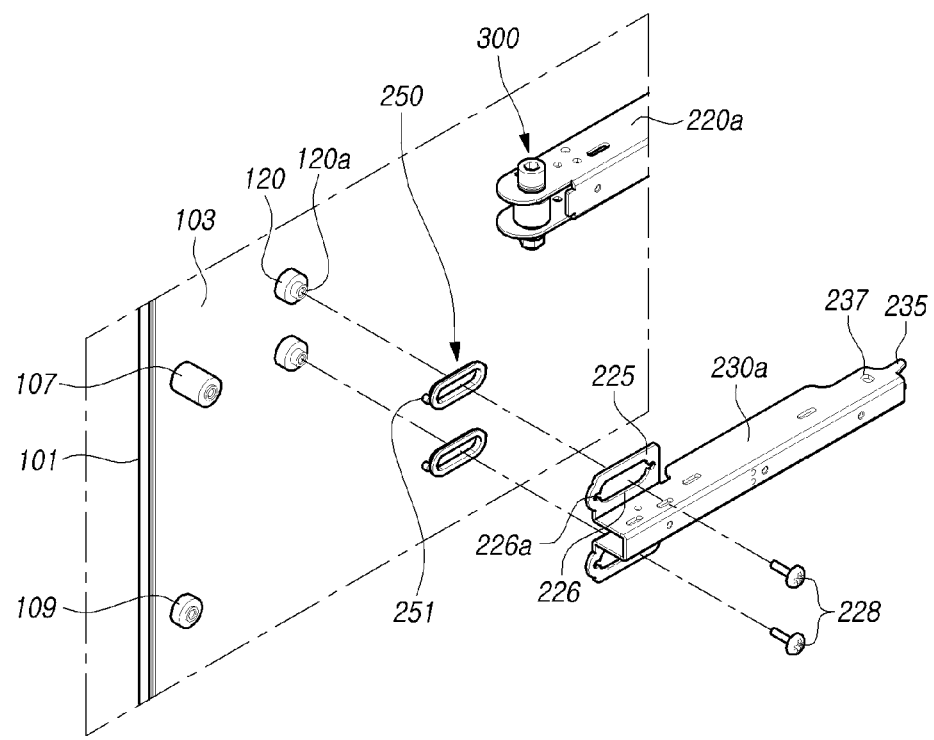
Figure 9:
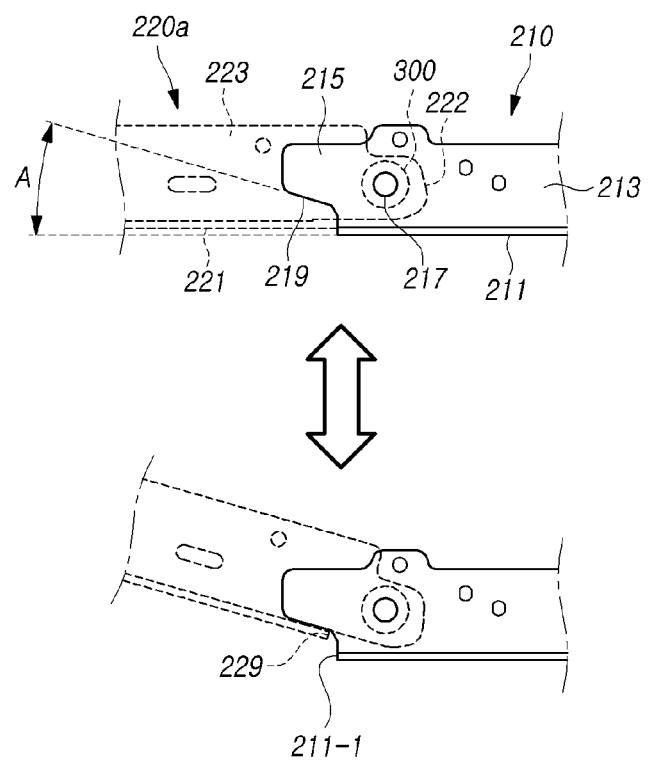
FIGS. 9 and 10 are plan views showing a bending operation of the flexible display device according to embodiments of the present disclosure.
Figure 10:
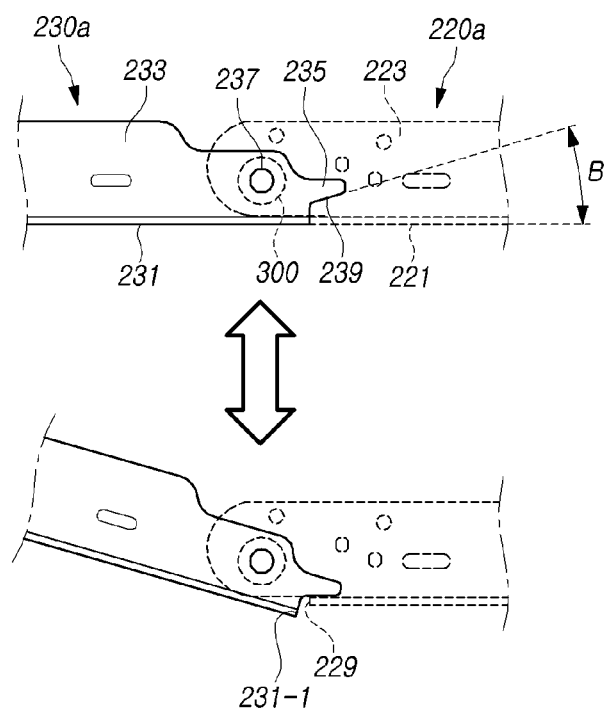
Figure 11:
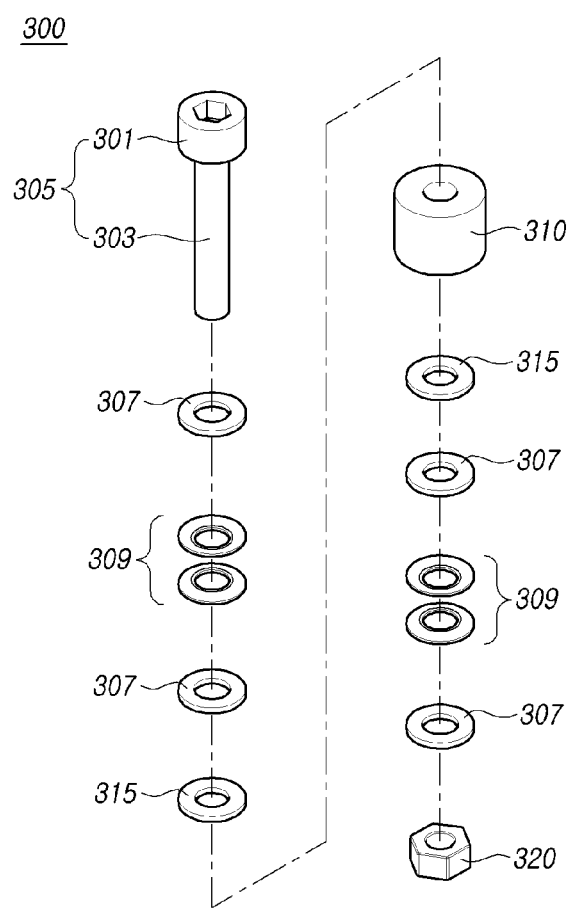
FIG. 11 is a perspective view showing a flexible display device according to embodiments of the present disclosure.
Figure 12:
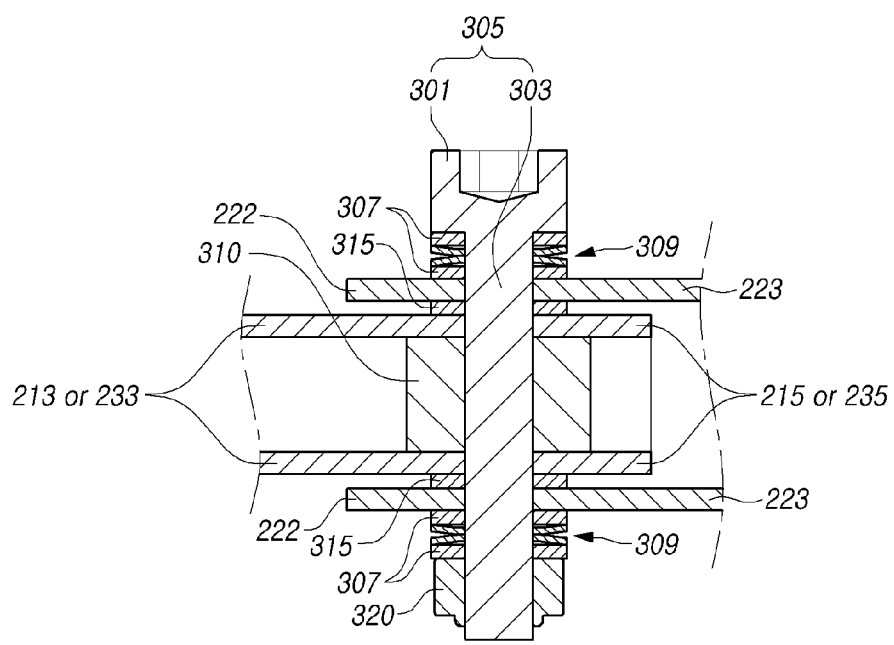
FIG. 12 is a sectional view showing a flexible display device according to embodiments of the present disclosure.

FIG. 1 is a perspective view showing a flexible display device according to one or more embodiments of the present disclosure, FIGS. 2 and 3 are plan views showing a flexible display device according to embodiments of the present disclosure, FIGS. 4 to 8 are perspective views showing a flexible display device according to embodiments of the present disclosure, FIGS. 9 and 10 are plan views showing a bending operation of the flexible display device according to embodiments of the present disclosure, FIG. 11 is a perspective view showing a flexible display device according to embodiments of the present disclosure, and FIG. 12 is a sectional view showing a flexible display device according to embodiments of the present disclosure. All the components of each flexible display device according to all embodiments of the present disclosure are operatively coupled and configured.

As illustrated in FIGS. 1 to 12, a flexible display device according to embodiments of the present disclosure can include a back cover 103 supporting a rear surface of a display panel 101, a plurality of fixing sliders 120 arranged and fixed in left and right directions (e.g., longitudinal direction) on a rear surface of the back cover 103, a central frame 210 disposed at a rear center of the back cover 103, a pair of connection frames 220a and 220b having one end (e.g., a first end) rotatably connected to both ends (e.g., longitudinal ends) of the central frame 210 and provided with slot holes 226 through which the fixing sliders 120 are slidably supported, and a hinge member 300 connecting both ends of the central frame 210 and one end of the connection frames 220a and 220b.

For example, the flexible display device can include a plurality of hinge members 300, with a first hinge member 300 connecting a first end of the central frame 210 to a first end of the connection frame 220a (e.g., first connection frame 220a), and a second hinge member 300 connecting a second end of the central frame 210 opposite to the first end of the central frame 210 to a first end of the connection frame 220b (e.g., second connection frame 220b).

First, in embodiments of the present disclosure, the reference of the direction is described in the display panel 101 side as a front side and the back cover 103 side as a rear side. And, as shown in FIG. 1, the reference of the direction will be described in the left and right, up and down directions in the direction facing the back cover 103.

In addition, the connection frames 220a and 220b and the side frames 230a and 230b disposed on the left and right sides of the back cover 103 can be configured to be connected in one or more pairs, respectively, but in embodiments of the present disclosure, the connection frames 220a and 220b and the side frames 230a and 230b are each provided as a pair as an example.

In embodiments of the present disclosure, the display panel 101 is coupled to the front of the back cover 103, and the display panel 101 can be applied regardless of a liquid crystal display panel or a light emitting display panel.

For example, when the display panel 101 is configured as an LCD panel, the display panel can further include a backlight unit irradiating light onto the LCD panel, a lower polarization plate attached to a lower substrate, and an upper polarization plate attached to the front surface of an upper substrate. The specific configurations of the lower substrate and the upper substrate can be formed in various manners known to those skilled in the art according to, for example, twisted nematic (TN) mode, vertical alignment (VA) mode, in plane switching (IPS) mode, and fringe field switching (FFS) mode.

When the display panel 101 is configured as a light emitting display panel, the light emitting display panel can include a lower substrate in which a plurality of light emitting cells are formed in respective areas (e.g., separate areas) defined by gate lines, data lines, and power (VDD) lines, and the light emitting display panel can include an upper substrate face to face bonded to the lower substrate (e.g., a surface/face of the upper substrate can be bonded to a face/surface of the lower substrate, for instance, a lower surface of the upper substrate can be bonded to an upper surface of the lower substrate, and vice versa). This configuration is known in the art to which the present disclosure is relevant, and thus related drawings and detailed description are not provided herein.

As such, the display panel 101 can be used irrespective of its type in embodiments of the present disclosure. Accordingly, the following description is given irrespective of the type of a display panel.

In embodiments of the present disclosure, the curvature change of the display panel 101 is made by a user holding both ends of the display panel 101 and the back cover 103 and bending forward. As shown in FIG. 2 while the central frame 210 and the sequentially connected connection frames 220a and 220b and the side frames 230a and 230b rotate the hinge member 300 as an axis (for example, the hinge member 300 can be the axis of rotation for the connection frames 220a and 220b and the side frames 230a and 230b), and the radius of curvature is set in various ways even in flat mode and curved mode.

In particular, in embodiments of the present disclosure, each of the connection frames 220a and 220b and the side frames 230a and 230b sequentially connected to the central frame 210 and can rotate independently about the hinge member 300 as an axis. Therefore, as shown in FIG. 3, only a portion of the display panel 101 can be bent.

Here, the connection frames 220a and 220b and the side frames 230a and 230b sequentially connected to the center frame 210 are made of a metal material, such as an electrogalvanized steel plate, aluminum alloy plate, or stainless steel plate with high rigidity so as to bend the display panel 101 and the back cover 103. Therefore, it is possible to support the back cover 103 without deformation or damage.

For example, in embodiments of the present disclosure, the radius of curvature R of the display panel 101 and the back cover 103 can be bent in an approximate range of 700 to 1000 mm, and only a partial region can be bent.

In the flat mode, the center of curvature of the display panel 101 is located on a plane parallel to the display panel 101 as shown in the upper part of FIGS. 1 and 2, and in the curved mode, as shown in the lower part of FIG. 2 and FIG. 3, the center of curvature of the display panel 101 is located at the front side of the display panel 101.

In addition, the connection frames 220a and 220b are provided with slot holes 226 elongated in (i.e., extending in) the left and right directions of the back cover 103, fixing sliders 120 are provided on the rear surface of the back cover 103 at a position corresponding to the slot holes 226.

Accordingly, when the connection frames 220a and 220b rotate forward about the axis of the hinge member 300, the fixing sliders 120 are supported by the slot holes 226 and slide to absorb the length change in the left and right directions due to the bending of the back cover 103.

One end of the connection frames 220a and 220b is rotatably connected to the end of the central frame 210 through a hinge member 300.

The central frame 210 disposed at the rear center of the back cover 103 can include a main plate 211 disposed parallel to the back cover 103, and an extension plate 213 bent at the upper end and lower end of the main plate 211 to extend forward toward the back cover 103 and provided with a first coupling hole 217 to which the hinge member 300 is coupled.

The main plate 211 and the extension plate 213 provided at the upper end and lower end of the main plate 211 are formed of a beam having a "⌐" shape cross-section connected at right angles to each other. Therefore, when the back cover 103 is bent, it supports the rotational force of the connection frames 220a and 220b connected to both sides.

And, each of the connection frames 220a and 220b rotatably connected to the ends of the central frame 210 can include a center plate 221 disposed parallel to the back cover 103, a bent plate 223 bent at an upper end and lower end of the center plate 221 and extending forward toward the back cover 103, and a protruding flange 222 extending from both ends of the bent plate 223 in the longitudinal left and right directions and provided with a second coupling hole 227 communicating with the first coupling hole 217 to which the hinge member 300 is coupled. For example, ends (e.g., both ends) of each of the connection frames 220a and 220b can include protruding flanges 222 extending from the respective bent plates 223, and the protruding flange 222 at each end can be in the form of two separate protruding flanges 222. Further, the bent plate 223 can be provided in plurality by extending from lateral ends of the center plate 221 and the bent plates 223 can be disposed perpendicular to the back cover 103, so as to form a substantially U-shaped member.

The connecting frames 220a and 220b are formed of a beam having a "⌐" shape cross-section in which the center plate 221 and the bent plate 223 provided at the upper and lower ends of the center plate 221 are connected at right angles. Therefore, the connection frames 220a and 220b rotate forward about the hinge member 300 without being deformed when the back cover 103 is bent.

And, the protruding flange 222 extending in the longitudinal direction from the end of the bending plate 223 is connected to the hinge member 300 through the first coupling hole 217 and the second coupling hole 227 while covering the outside of the extension plate 213 of the central frame 210.

Here, a support flange 229 is provided at an end of the center plate 221. The support flange 229 is formed to extend in the longitudinal direction so as to have a space with the bent plate 223.

The support flange 229 is formed to be supported by the end 211-1 of the main plate 211 in the flat mode state. Therefore, when the user changes from the curved mode to the flat mode and the connection frames 220a and 220b return to their original positions, the rotation of the connection frames 220a and 220b is limited and the flat mode state is maintained.

The extension plate 213 of the central frame 210 is provided with a first insertion flange 215 that is extended from both ends to be inserted and supported inside the protruding flange 222 of the connection frames 220a and 220b. The first insertion flange 215 is provided with a first inclined surface 219 that is formed to become wider from the end of the first insertion flange 215 toward the extension plate 213.

Here, the first inclined surface 219 is formed to form an angle "A" with the main plate 211 when viewed in the axial direction of the hinge member 300 as shown in FIG. 9. The angle "A" is determined depending on the area of the display panel 101, the radius of curvature R of the display panel 101 and the back cover 103, and whether the side frames 230a and 230b are additionally configured or omitted, and it is set in the range of approximately 10° to 30°.

Therefore, when the user changes from the flat mode to the curved mode, the connection frames 220a and 220b rotate while the first inclined surface 219 is supported on the inner surface of the center plate 221 and the rotation is stopped to maintain the curved mode.

For example, when changing from the flat mode to the curved mode in embodiments of the present disclosure, the first inclined surface 219 is supported by the inner surface of the center plate 221 and stops, and when changing from the curved mode to the flat mode, the support flange 229 is supported by the end 211-1 of the main plate 211 and stops.

These embodiments of the present disclosure can include a pair of side frames 230a and 230b having one end rotatably connected to an end of the connection frames 220a and 220b by a respective one of the hinge members 300 and the pair of side frames 230a and 230b are provided with the slot holes 226 through which the fixing sliders 120 are slidably supported.

The side frames 230a and 230b can be additionally configured or omitted depending on the area of the display panel 101. In the present embodiments, the configuration of the side frames 230a and 230b will be described as an example.

Each of the side frames 230a and 230b can include a vertical plate 231 disposed parallel to the back cover 103, and a horizontal plate 233 bent at an upper end and lower end of the vertical plate 231 and extending forward, and provided with a third coupling hole 237 communicating with the second coupling hole 227 and coupling the hinge member 300. For example, each of the side frames 230a and 230b can include a plurality of horizontal plates 233 extending from the vertical plate 231 and disposed perpendicular to the back cover 103, so as to form a substantially U-shaped member.

The side frames 230a and 230b are also formed of a beam having a "⌐" shape cross-section in which the vertical plate 231 and the horizontal plate 233 are connected at right angles, like the above-described central frame 210 and connection frames 220a and 220b. Accordingly, when the back cover 103 is bent, the side frames 230a and 230b are not deformed and rotate forward about the hinge member 300.

The horizontal plate 233 is provided with a second insertion flange 235 extending from one end to be inserted and supported inside the projecting flange 222 of the connection frames 220a and 220b. The second insertion flange 235 is provided with a second inclined surface 239 that is formed to become wider from the end of the second insertion flange 235 toward the horizontal plate 233.

As shown in FIG. 10, the second inclined surface 239 is formed to form an angle "B" with the vertical plate 231 when viewed in the axial direction of the hinge member 300. The angle "B" is determined depending on the area of the display panel 101, the radius of curvature R of the display panel 101 and the back cover 103, and whether the side frames 230a and 230b are additionally configured or omitted, and it is set equal to the angle "A" in the range of approximately 10° to 30°.

Therefore, when the user changes from the flat mode to the curved mode, the side frames 230a and 230b rotate while the second inclined surface 239 is supported by the inner surface of the center plate 221 and the rotation is stopped to maintain the curved mode.

For example, when changing from the flat mode to the curved mode, the second inclined surface 239 of the side frames 230a and 230b is supported by the inner surface of the center plate 221 and stops. And when changing from the curved mode to the flat mode, the support flange 229 of the connecting frames 220a and 220b is supported by the end 231-1 of the vertical plate 231 and stops.

A coupling flange 225 bent parallel to the back cover 103 and having slot holes 226 is provided at the center of the bent plate 223 and at an end of the horizontal plate 233. Slot holes 226 can be coupled to a sliding support member 250 supported by sliding a support end 120a of the fixing sliders 120.

In addition, the coupling flange 225 is provided with extended grooves 226a on both sides of the slot holes 226 and protruding fixing portions 251 inserted into the extended grooves 226a of the coupling flange 225 on both sides of the sliding support member 250.

Accordingly, the protruding fixing portions 251 provided on both sides of the sliding support member 250 are elastically deformed and coupled to the extension grooves 226a of the slot hole 226, so that without a separate fastening member, the sliding support member 250 does not separate from the slot holes 226 and maintains its original position.

A fastening member is coupled to each support end 120a that protrudes backward from the end of the fixing sliders 120 and is supported by the sliding support member 250, and the sliding is made while a head of the fastening member 228 is supported on the rear surface of the coupling flange 225. For example, a plurality of fastening member 228 can be provided, and each fastening member 228 couples a respective one of the coupling flanges 225 to a respective one of the fixing sliders 120, as a support end 120a of the respective fixing slider 120.

Accordingly, the fixing sliders 120 are fixed to the back cover 103 slide without being separated from the connection frames 220a and 220b or the side frames 230a and 230b.

Meanwhile, at the left and right ends (e.g., longitudinal ends) of the back cover 103, reinforcing members 105a and 105b disposed in the vertical direction can be coupled to the fixing members 107 and 109 fixed to the back cover 103.

For example, in the embodiments of the present invention, when changing from the flat mode to the curved mode, the user holds both ends of the display panel 101 and the back cover 103 and bends them forward, so reinforcing members 105a and 105b are coupled to reinforce the rigidity at both ends.

In addition, the reinforcing members 105a and 105b are provided with a knob 110 (e.g., bent portion) protruding stepwise to the rear so that a space is provided between the reinforcing member 105a and 105b (e.g., a space is provided between the reinforcing members 105a and 105b and the back cover 103), so that the user can easily change the curvature of the display panel 101 by holding the knob 110.

The hinge members 300 rotatably connect the central frame 210 and the connection frames 220a and 220b and the side frames 230a and 230b. Each hinge member 300 can include a first member 305 including a body 303 having a threaded portion on an outer circumferential surface and a head 301 provided at an end of the body 303, and penetrating the first coupling hole 217 and the second coupling hole 227 or passing through the second coupling hole 227 and the third coupling hole 237, a second member 320 screwed to (e.g., threadingly engaging) an end of the first member 305, and a third member 310 having upper and lower surfaces in close contact with an inner surface of the extension plate 213 or the horizontal plate 233 and coupled thereto, and passing through the body 303 of the first member 305, as illustrated in FIG. 12.

The first member 305 is provided with a body 303 having a threaded portion on an outer circumferential surface, similar to a bolt, and a head 301 is provided at an end of the body 303. The second member 320 is provided with a threaded portion on an inner circumferential surface of the second member 320, similar to a nut, is screwed with the body 303 of the first member 305, and presses the third member 310 in the axial direction. For example, the threaded portion of the second member 320 engages with the threaded portion of the first member 305.

The third member 310 provides frictional force so that the central frame 210, the connection frames 220a and 220b and the side frames 230a and 230b can be maintained in a stationary state by the fastening force of the first member 305 and the second member 320.

The third member 310 can be formed of at least one material selected from among polyacetal (POM), polyamide (PA), polycarbonate (PC), polyimide (PI), polybutylene terephthalate (PBT), and polyethylene terephthalate (PET).

In addition, the hinge member 300 can further include a fourth member 315 coupled between the extension plate 213 and the protruding flange 222 or coupled between the horizontal plate 233 and the bent plate 223, through which the first member 305 passes.

The fourth member 315 maintains the hinge member 300 at a predetermined distance in the axial direction by providing a friction force as a pressing force in the axial direction by the fastening force between the first member 305 and the second member 320. Accordingly, it is prevented that the extension plate 213 and the protruding flange 222 are compressed excessively or the horizontal plate 233 and the bent plate 223 are excessively compressed.

In addition, it is prevented that excessive force is required when rotating the central frame 210, the connection frames 220a and 220b, and the side frames 230a and 230b at a predetermined angle.

The hinge member 300 can further include an elastic support member 309 coupled between the protruding flange 222 or the bent plate 223 and the head 301, and between the protruding flange 222 or the bent plate 223 and the second member 320, and elastically deformed in the axial direction of the hinge member 300.

The elastic support member 309 can be composed of one or more elements, and can be stacked and coupled in an axial direction. In embodiments of the present disclosure, the elastic support member 309 is stacked two at a time in the axial direction, and coupled between the protruding flange 222 or the bent plate 223 and the head 301, and coupled between the protruding flange 222 or the bent plate 223 and the second member 320, which is illustrated as an example.

Each elastic support member 309 has an inner peripheral surface and an outer peripheral surface through which the first member 305 penetrates, and each elastic support member 309 forms a cone-shaped step in the axial direction and has a trapezoidal cross-sectional shape. When a pressing force in the axial direction by the fastening force between the first member 305 and the second member 320 is applied, the elastic support member 309 generates an elastic force in the axial direction.

Therefore, even if an excessive axial pressing force is applied, the head 301 of the first member 305 is prevented from being compressed and fixed against the protruding flange 222 or the bent plate 223, and the second member 320 is prevented from being pressed and fixed against the protruding flange 222 or the bending plate 223. In addition, it is possible to prevent the central frame 210, the connection frames 220a and 220b, and the side frames 230a and 230b from requiring excessive force when rotating at a predetermined angle.

The hinge member 300 can further include a fifth member 307 coupled between the head 301 and the elastic support member 309, and between the second member 320 and the elastic support member 309.

The fifth member 307 prevents deformation or damage that can occur while torsion is applied to the elastic support member 309 while the head 301 and the second member 320 rotate. The fifth members 307 can include a fifth member 307 connected directly between the head 301 and the elastic support member 309, a fifth member 307 connected directly between the elastic support member 309 and one of the fourth member 315, the protruding flange 222 and the bending plate 223, a fifth member 307 connected directly between the elastic support member 309 and one of the fourth member 315, the protruding flange 222 and the bending plate 223, and a fifth member 307 connected directly between the elastic support member 309 and the second member 320.

As described above, according to embodiments of the present disclosure, there can be provided a flexible display device in which a user can arbitrarily change the curvature into a flat display mode and a curved display mode.

Further, according to embodiments of the present disclosure, there can be provided a flexible display device capable of accommodating various needs of a user by being able to easily implement a desired curvature from a central portion of a display panel to both ends of a display panel irrespective of its size in the display device.

Various embodiments described herein may be implemented in a computer-readable medium using, for example, software, hardware, or some combination thereof. For example, the embodiments described herein may be implemented within one or more of Application Specific Integrated Circuits (ASICs), Digital Signal Processors (DSPs), Digital Signal Processing Devices (DSPDs), Programmable Logic Devices (PLDs), Field Programmable Gate Arrays (FPGAs), processors, controllers, micro-controllers, microprocessors, other electronic units designed to perform the functions described herein, or a selective combination thereof. In some cases, such embodiments are implemented by the controller. For Example, the controller is a hardware-embedded processor executing the appropriate algorithms (e.g., flowcharts) for performing the described functions and thus has sufficient structure.

Also, the embodiments such as procedures and functions may be implemented together with separate software modules each of which performs at least one of functions and operations. The software codes can be implemented with a software application written in any suitable programming language. Also, the software codes can be stored in the memory and executed by the controller, thus making the controller a type of special purpose controller specifically configured to carry out the described functions and algorithms. Thus, the components shown in the drawings have sufficient structure to implement the appropriate algorithms for performing the described functions.

The above description has been presented to enable any person skilled in the art to make and use the technical idea of the present disclosure, and has been provided in the context of a particular application and its requirements. Various modifications, additions and substitutions to the described embodiments will be readily apparent to those skilled in the art, and the general principles defined herein can be applied to other embodiments and applications without departing from the spirit and scope of the present disclosure. The above description and the accompanying drawings provide an example of the technical idea of the present disclosure for illustrative purposes only. For example, the disclosed embodiments are intended to illustrate the scope of the technical idea of the present disclosure.

Thus, the scope of the present disclosure is not limited to the embodiments shown, but is to be accorded the widest scope consistent with the claims. The scope of protection of the present disclosure should be construed based on the following claims, and all technical ideas within the scope of equivalents thereof should be construed as being included within the scope of the present disclosure.

What is claimed is:

1. A flexible display device comprising:
a display panel;
a back cover supporting a rear surface of the display panel;
a plurality of fixing sliders fixed on a rear surface of the back cover and arranged along a longitudinal direction;
a central frame disposed at a center of the rear surface of the back cover and having first and second longitudinal ends;
a pair of connection frames rotatably connected to the first and second longitudinal ends of the central frame and provided with slot holes through which respective fixing sliders among the plurality of fixing sliders are slidably supported; and
a plurality of hinge members, each hinge member connecting a respective one of the first and second longitudinal ends of the central frame to a respective one of the pair of connection frames,
wherein the central frame comprises:

a main plate extending parallel to the back cover; and
extension plates extending from an upper end and lower end of the main plate towards the back cover, each extension plate including a first coupling hole coupled to a respective one of the hinge members,
wherein each of the pair of connection frames further comprises:
a center plate extending parallel to the back cover;
bent plates extending from an upper end and lower end of the center plate and extending towards the back cover; and
protruding flanges extending from ends of the bent plate, each protruding flange provided with a second coupling hole communicating with the first coupling hole of a respective one of the extension plates and coupled to a respective one of the hinge members,
wherein the center plate includes support flanges provided at opposing ends of the main plate, and
wherein the support flanges extend in the longitudinal direction, are spaced from the bent plates, and limit rotation of the connection frames.

2. The flexible display device of claim 1, further comprising a pair of side frames, each side frame having one end rotatably connected to an end of a respective one of the connection frames by a respective one of the hinge members and is provided with a slot hole through which a respective one of the fixing sliders is slidably supported.

3. The flexible display device of claim 2, wherein each of the side frames comprises:
a vertical plate extending parallel to the back cover; and
horizontal plates extending from an upper end and lower end of the vertical plate and extending towards the back cover, and
wherein each of the horizontal plates is provided with a third coupling hole communicating with a respective one of the second coupling holes and are coupled to a respective one of the hinge members.

4. The flexible display device of claim 3, wherein each horizontal plate is provided with a second insertion flange extending from one end of the horizontal plate and supported inside a respective one of the protruding flanges.

5. The flexible display device of claim 4, wherein each second insertion flange is provided with a second inclined surface forming an angle with a respective one of the vertical plates when viewed in an axial direction of the hinge member, so that when the side frames rotate, the second inclined surfaces are supported on the inner surface of the center plate and the rotation of the side frames is stopped.

6. The flexible display device of claim 3, wherein each hinge member comprises:
a first member including:
a body having a threaded portion on an outer circumferential surface, and
a head provided at an end of the body, and penetrating a respective one of the first coupling holes and a respective one of the second coupling holes or passing through the respective second coupling hole and a respective one of the third coupling holes;
a second member threadingly engaging an end of the first member; and
a third member having upper and lower surfaces in contact with an inner surface of a respective one of the extension plates or an inner surface of a respective one of the horizontal plates and passing through the body of the first member.

7. The flexible display device of claim 6, wherein each hinge member further comprises a fourth member coupled between the respective extension plate and a respective one of the protruding flanges or coupled between the respective horizontal plate and a respective one of the bent plates, and
wherein for each hinge member, the first member passes through the fourth member.

8. The flexible display device of claim 7, wherein each hinge member further comprises an elastic support member coupled between the respective protruding flange or the respective bent plate and the head, and between the respective protruding flange or the respective bent plate and the second member, and
wherein the elastic support member is configured to elastically deform in the axial direction of the hinge member.

9. The flexible display device of claim 1, wherein each of the bent plates is provided with a coupling flange having the slot holes.

10. The flexible display device of claim 9, further comprising sliding support members coupled to the coupling flanges.

11. The flexible display device of claim 10, wherein each coupling flange is provided with extended grooves on sides the slot hole, and
wherein each sliding support member includes protruding fixing portions inserted into the extended grooves of the respective coupling flange to couple the sliding support member to the respective coupling flange.

12. The flexible display device of claim 11, further comprising a plurality of fastening members coupling the coupling flanges to the fixing sliders.

13. A flexible display device comprising:
a display panel;
a back cover supporting a rear surface of the display panel;
a plurality of fixing sliders fixed on a rear surface of the back cover and arranged along a longitudinal direction;
a central frame disposed at a center of the rear surface of the back cover and having first and second longitudinal ends;
a pair of connection frames rotatably connected to the first and second longitudinal ends of the central frame and provided with slot holes through which respective fixing sliders among the plurality of fixing sliders are slidably supported; and
a plurality of hinge members, each hinge member connecting a respective one of the first and second longitudinal ends of the central frame to a respective one of the pair of connection frames,
wherein the central frame comprises:
a main plate extending parallel to the back cover; and
extension plates extending from an upper end and lower end of the main plate towards the back cover, each extension plate including a first coupling hole coupled to a respective one of the hinge members,
wherein each of the pair of connection frames further comprises:
a center plate extending parallel to the back cover;
bent plates extending from an upper end and lower end of the center plate and extending towards the back cover; and
protruding flanges extending from ends of the bent plate, each protruding flange provided with a second coupling hole communicating with the first coupling hole of a respective one of the extension plates and coupled to a respective one of the hinge members, and wherein each extension plate is provided with a first insertion flange extending from both ends of the extension plate, each first insertion flange being supported inside a respective one of the protruding flanges of the connection frames.

14. The flexible display device of claim 13, wherein each first insertion flange is provided with a first inclined surface that is wider from an end of the first insertion flange toward the extension plate, so that when the connection frames rotate, the first inclined surfaces are supported on an inner surface of the center plate and the rotation of the connection frames stops.

15. A flexible display device comprising:
a display panel;
a back cover coupled to the display panel;
a central frame disposed at a rear surface of the back cover;
a pair of connection frames rotatably connected to opposing ends of the central frame, each connection frame including:
a coupling flange having a slot hole and being coupled to the back cover by a fastener; and
a plurality of hinge members, each hinge member rotatably connecting a respective one of the opposing ends of the central frame to a respective one of the pair of connection frames,
wherein each connection frame further includes support flanges provided at opposing ends of the connection frame,
wherein the support flanges extend in a longitudinal direction and engage the central frame to limit rotation of the connection frames,
wherein each of the opposing ends of the central frame includes a first insertion flange extending in the longitudinal direction,
wherein each connection frame include a protruding flange, and
wherein each first insertion flange is supported inside a respective one of the protruding flanges the connection frames.

* * * * *